United States Patent
Trujillo et al.

(10) Patent No.: US 7,522,822 B2
(45) Date of Patent: Apr. 21, 2009

(54) HALOGEN LAMP ASSEMBLY WITH INTEGRATED HEAT SINK

(76) Inventors: Robert Trujillo, 805 Daffodil Way, San Jose, CA (US) 95117; Roger Anderson, 776 Pear Ave., Sunnyvale, CA (US) 94087; David Carlson, 4054 Claitor Way, San Jose, CA (US) 95132; Michael Hale, 3377 Hillside Ct., San Jose, CA (US) 95132

( * ) Notice: Subject to any disclaimer, the term of this patent is extended or adjusted under 35 U.S.C. 154(b) by 588 days.

(21) Appl. No.: 10/752,145

(22) Filed: Jan. 6, 2004

(65) Prior Publication Data

US 2005/0146257 A1    Jul. 7, 2005

(51) Int. Cl.
*A21B 2/00* (2006.01)
(52) U.S. Cl. .......................................... 392/416; 313/17
(58) Field of Classification Search ................. 392/416; 313/17
See application file for complete search history.

(56) References Cited

U.S. PATENT DOCUMENTS

| | | | |
|---|---|---|---|
| 3,936,686 A * | 2/1976 | Moore | 313/36 |
| 4,598,194 A | 7/1986 | Halberstadt et al. | |
| 4,600,857 A | 7/1986 | Suhar | |
| 4,841,422 A * | 6/1989 | Groh | 362/294 |
| 5,268,613 A * | 12/1993 | Cunningham | 313/113 |
| 5,329,436 A * | 7/1994 | Chiu | 362/294 |
| 5,420,769 A * | 5/1995 | Ahlgren et al. | 362/294 |
| 5,458,505 A | 10/1995 | Prager | |
| 5,873,650 A | 2/1999 | Luk et al. | |
| 5,951,896 A | 9/1999 | Mahawili | |
| 5,968,397 A | 10/1999 | Wyland et al. | |
| 6,167,195 A | 12/2000 | Moslehi et al. | |
| 6,225,731 B1 * | 5/2001 | Auyang | 313/25 |
| 6,310,323 B1 | 10/2001 | Mahawili et al. | |
| 6,440,221 B2 | 8/2002 | Shamouilian et al. | |
| 6,517,218 B2 | 2/2003 | Hochstein | |
| 6,705,393 B1 * | 3/2004 | Hsu | 165/185 |
| 6,744,187 B1 * | 6/2004 | Wimberly | 313/110 |
| 2002/0111043 A1 | 8/2002 | Mahawili | |
| 2006/0163990 A1 * | 7/2006 | Huizar et al. | 313/113 |

* cited by examiner

*Primary Examiner*—Thor S Campbell
(74) *Attorney, Agent, or Firm*—Janah & Associates, P.C.

(57) ABSTRACT

A halogen lamp assembly 20 for a substrate processing chamber 100 has a halogen lamp 22 and a ceramic heat sink monolith 24. The halogen lamp 22 includes a filament 28 and a pair of electrical connectors 30 encapsulated in an envelope 26 having a pinch seal end 34. The ceramic heat sink monolith 24 includes a block 38 and an array of spaced apart posts 40 projecting outwardly from the block 38. The block 38 includes a cavity 42 that has a recessed inner surface 44 shaped to mate with the pinch seal end 34 of the lamp 22 and an opening that allows the electrical connectors 30 of the halogen lamp 22 to pass through.

20 Claims, 3 Drawing Sheets

US 7,522,822 B2

HALOGEN LAMP ASSEMBLY WITH INTEGRATED HEAT SINK

BACKGROUND

The present invention relates to a halogen lamp assembly for a substrate processing chamber.

Substrate processing chambers, in which a substrate such as a semiconductor wafer or display is processed, often use halogen lamps for heating the substrate or chamber walls. Halogen lamps are incandescent lamps that typically have tungsten filaments in a halogen gas environment encapsulated in a quartz glass envelope. The envelope is constricted at the base of the lamp to form a pinch seal end about metal connectors that pass current to the filament. These lamps give off heat that is used to anneal a layer of material on the substrate, as for example, in a rapid thermal processing (RTP) chamber; or to decompose a gas to form a layer on a substrate as in an epitaxial chamber. The halogen lamps can generate the infrared heat energy quickly, controllably, and with uniform coverage, and thus they are useful for rapidly heating the substrate.

However, the heat emitted by the halogen lamp can cause failure of critical regions of the lamp and thereby reduce the lifetime of the lamp. One region of the lamp that is particularly susceptible to failure is the pinch seal end. The pinch seal end is exposed to even higher temperatures by the additional resistive heat generated from the passage of the electrical current through the connectors passing through this region. The high operating temperatures can cause the glass to metal seal to fail due to stresses arising from a mismatch in thermal coefficients of expansion of the glass, metal, and glass to metal sealing material. The heat can also cause partial oxidation or other deterioration of the metal connectors. Thus, a halogen lamp with an expected lamp life of about 2000 hours or greater for a maximum operating temperature of 300° C. at the pinch seal end, has a much shorter lifetime of about 1000 hours when the operating temperature in the pinch seal end is 350° C., and a lifetime of only about 250 hours when the operating temperature is 400° C.

Thus it is desirable to have a halogen lamp assembly with a heat sink that is capable of reducing the operating temperature of the lamp. It is also desirable to keep the pinched seal region temperatures below critical levels to reduce premature failure of the lamp. It is also desirable to remove the heat generated by the lamp during its operation without complex cooling equipment.

SUMMARY

A halogen lamp assembly for a substrate processing chamber comprises a halogen lamp and a ceramic heat sink monolith. The halogen lamp has a substantially transparent envelope with a pinch seal end, a filament in the envelope, and a pair of electrical connectors that connect to the filament and pass through the pinch seal end. The ceramic heat sink monolith comprises a block having a recessed inner surface shaped to mate with the pinch seal end of the halogen lamp, the block having an opening that allows the electrical connectors of the halogen lamp to pass through. The ceramic heat sink monolith also comprises an array of spaced apart posts projecting outwardly from the block.

In one version, the ceramic heat sink monolith also mates with a receptacle in the substrate processing chamber. In another version, the heat sink block is rectangular and a circular plate extends from the block with a hole aligned to the opening in the block. In this version, a pair of arrays of posts project outwardly from the opposing external surfaces of the block.

A substrate processing chamber uses a plurality of the halogen lamp assemblies. The substrate processing chamber also includes enclosing walls, a substrate support, a gas distributor and a gas exhaust.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
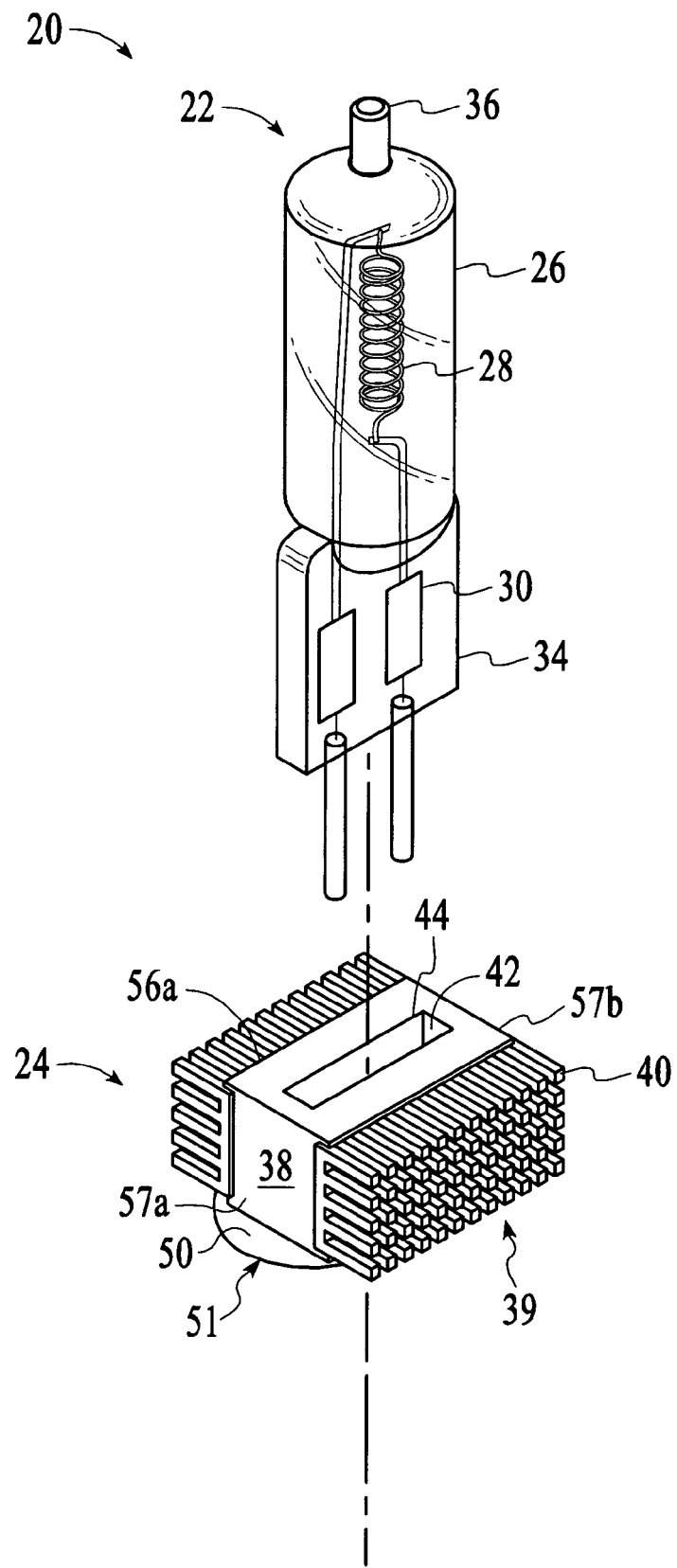
FIG. 1 is an exploded perspective view of an embodiment of a halogen lamp assembly according to the present invention.
Figure 2:
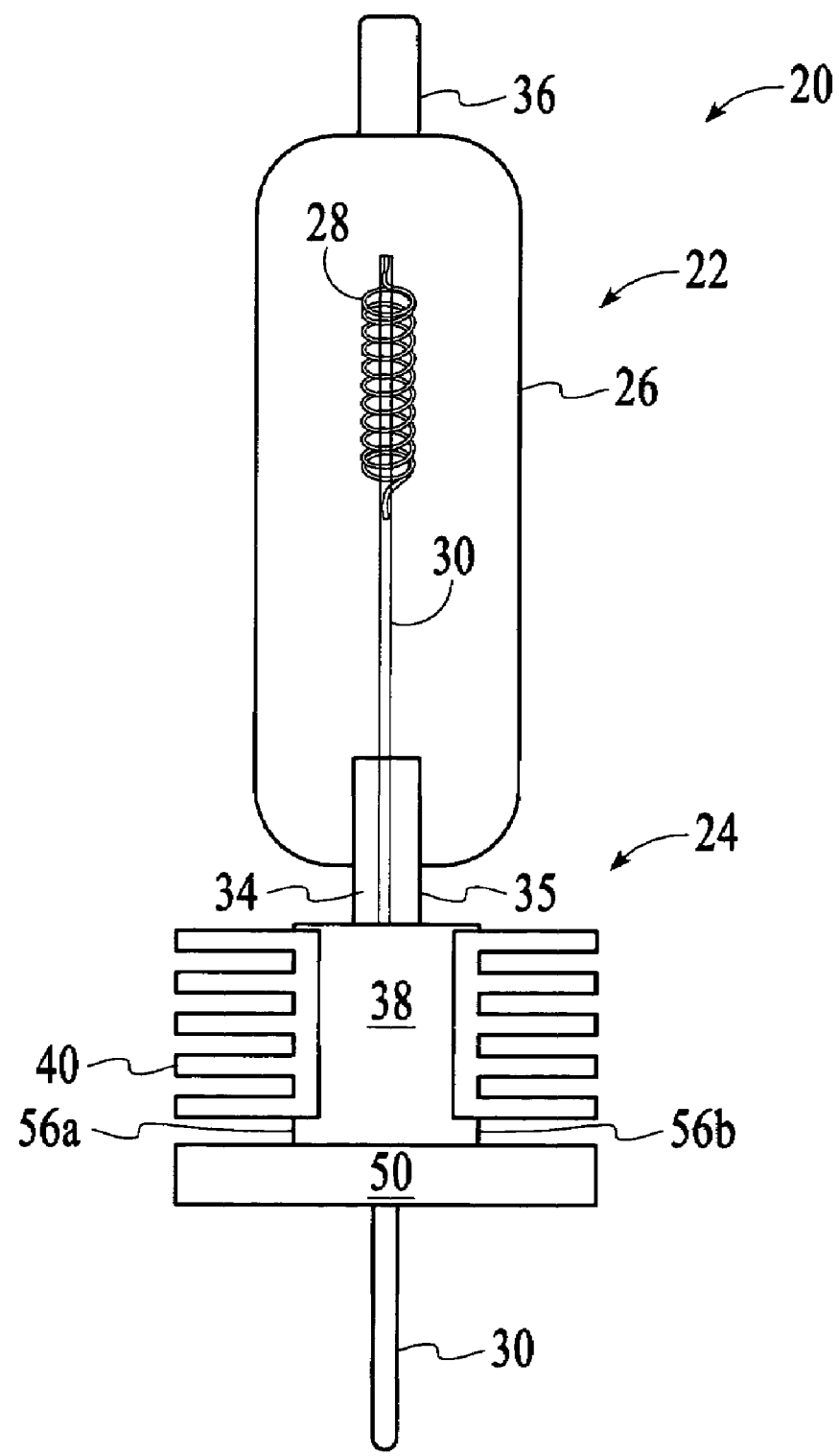
FIG. 2 is a side view of the embodiment of the halogen lamp assembly shown in FIG. 1.

An embodiment of a halogen lamp assembly 20 that may be used to supply heat energy to process substrates in a substrate processing chamber is illustrated in FIGS. 1 and 2. The halogen lamp assembly 20 comprises a halogen lamp 22 and a ceramic heat sink monolith 24. The halogen lamp 22 and ceramic heat sink monolith 24 described herein are illustrative exemplary embodiments and they should not be used to limit the scope of the invention.

Generally, the lamp 22 comprises a light transmissive envelope 26 that contains an internal atmosphere about a filament 28 and that allows electrical connectors 30 to pass therethrough. In the version shown, the envelope 26 comprises a tubular shape, a pinch seal end 34 and an evacuation tube 36. The shape of the envelope 26 can also be non-tubular, including conical, spherical or multi-arcuate shapes. The envelope 26 comprises quartz, silica glass, aluminosilicate glass or other suitably light-transmissive materials. The internal atmosphere contained in the envelope 26 comprises a halogen containing gas. The evacuation tube 36 is used to remove or add gases to the envelope 26 during manufacture and is subsequently sealed.

The filament 28 inside the envelope 26 comprises two ends which are electrically coupled to the electrical connectors 30. The filament 28 comprises a resistive metal wire, and in one version is a tungsten wire. The filament 28 can be a single or multiple coils or planar strips. The filament 28 is coupled to electrical connectors 30 at midpoints or endpoints of the filament 28. The electrical properties of the filament 28 can be tuned by its weight per length, diameter, or coil pitch (period of the coil divided by the diameter of the wire). In operation, the filament 28 can produce radiation at a wattage range up to about 2 kilowatts with operating voltages of about 120 $V_{AC}$. Typically, the radiation is in the deep ultraviolet, ultraviolet, visible, or infrared ranges.

The connectors 30 typically comprise metal wires or foils with good electrical conductivity, such as molybdenum wires. The connectors 30 may also comprise other metals, such as tungsten, nickel plated steel, or any other metal with a low electrical resistance and the ability to reliably carry high currents. In one version, the connectors 30 comprise first metal wires leading from the filament into the pinch seal end 34, foil sheets encapsulated inside the pinch seal 34 connected to the first metal wires, and second metal wires connected to the foil sheets and extending away from the pinch seal 34. The first and second metal wires may be directly connected to the foil sheets or connected to the foil sheets by additional wire leads welded onto the foil sheets and the first and second wires. In another version, the connectors 30 may comprise a single strand or multiple strands of wires connected to the filament 28 and passing through the pinch seal end 34.

The pinch seal end 34 comprises the region of the envelope 26 which is physically constricted about the electrical connectors 30 as they enter into the envelope 26 to electrically couple an external power source to the filament 28. The connectors 30 pass through and are held in place by the pinch seal end 34. The pinch seal end 34 forms a hermetic seal to maintain the pressure and composition of the internal atmosphere of the envelope 26. In another version, the lamp 22 can have two pinch seal ends 34, at substantially opposite ends of the envelope 26, with a single connector 30 passing through each pinch seal end 34. In yet another version, there could be three connectors 30 passing through a single pinch seal end 34.

The halogen lamp assembly 20 further comprises a ceramic heat sink monolith 24, as illustrated in FIG. 1. The ceramic heat sink monolith 24 comprises a block 38 coupled directly to the pinch seal end 34 of the lamp 22. The block 38 draws heat energy out of the pinch seal end 34 and dissipates this energy directly to the environment, through convection and radiation. The block 38 comprises a unitary monolith that is absent interfaces or junctions within its volume that would generate additional thermal impedances in addition to the impedance of the bulk block material. Conventional lamp assembly heat sinks often contain multiple parts that contact at interfaces which have warps, roughness, or gaps. The poor contact between the part interfaces create thermal impedances that are much higher than the impedance of the solid conduction path of the bulk material. Thus, the unitary monolith block 38 provides a higher thermal conductivity compared to conventional heat sink assemblies due to the absence of such interfaces within its volume.

The block 38 also has a cavity 42 that receives the pinch seal end 34 of the lamp 22. The cavity 42 forms a recessed surface 44 that is shaped to mate with an external surface 35 of the pinch seal end 34 of the lamp 22. The mating between the external surface 35 of the pinch seal end 34 and the recessed inner surface 44 provides a substantially conformal interface between the lamp 22 and the heat sink 24 that maximizes heat transfer rates therebetween. Conventional lamp assembly heat sinks provide inefficient heat transfer due to non-conformal mating between the heat sink and the heat-generating lamp, or due to gaps or roughness between the contacting surfaces that have high thermal impedances. Any gap present between the external surface 35 and the recessed inner surface 44 is filled with a filler material comprising a ceramic to provide a continuous thermal interface between the external surface 35 of the pinch seal end 34 and the recessed inner surface 44 of the ceramic heat sink monolith 24.

The ceramic heat sink monolith 24 further comprises an array 39 of spaced apart posts 40 that project outwardly from the block 38. The array 39 comprises a two-dimensional grid of posts 40 that are periodically spaced apart in both array dimensions. For example, in one version, a single array 39 may comprises sixty posts 40 arranged in 5 rows of 12 posts each. However, the array 39 may comprise a different total number of posts 40. The exact number of rows and the exact number of posts 40 within each row may vary. The posts 40 project outwardly substantially perpendicularly from the plane from which they originate. The posts 40 receive heat that is generated at the pinch seal end 34 of the lamp 22 and passes conductively through the recessed inner surface of the block 38. The extended posts 40 dissipate the heat through radiation and convention to the surrounding environment. Preferably, the posts 40 form a unitary monolithic extension of the block 38 and do not have interfaces or junctions of different materials or parts therebetween. The posts 40 are part of the ceramic heat sink monolith 24.

In one version, a pair of arrays 39 of spaced apart posts 40 project outwardly from opposing external surfaces 56*a,b* of the block 38. The arrays 39 are on opposing surfaces 56*a,b* that are joined by side surfaces 57*a,b*. Having arrays 39 of posts 40 projecting only from two opposing surfaces 56*a,b* allows the halogen lamp assemblies 20 to be arranged close together with the side surfaces 57*a,b* abutting to one another in a ring concentric about a substrate in a chamber. This arrangement provides a high density of lamps to generate more uniform heat or greater amounts of heat without sacrificing heat dissipation.

In one version, each post 40 has an approximately rectangular cross-section over a post length that projects outward from the surface 56 of the block 38. The dimensions of the rectangular cross-section may vary over the length of the post 40. In one version, the posts 40 taper as they project outward from the block 38, with the cross-sectional area of the posts 40 decreasing with distance from the surface 56 of the block 38. The tapered post 40 increases heat conduction close to the block 38 from the larger cross-sectional area in contact and integral with the block 38 while providing more gas for efficient convection and radiation from the posts 40 along the projection further away from the block 38. In one version, the posts 40 have an average cross-sectional area of about 8 mm$^2$ to about 15 mm$^2$, an average length of about 8 mm to about 12 mm, and taper at an angle of up to about 3 degrees. In another version, the posts 40 comprise a ratio of average cross-sectional area to length of about 0.5 mm to about 2.0 mm.

The heat transfer from the pinch seal end 34 can be tuned by adjusting the size of the block 38, the cross-sectional dimensions and length of the posts 40, and the thermal conductivity of the ceramic material of the block 38. For example, the size of the block 38 and the cross-sectional dimensions and length of the posts 40 can be selected by constructing a mathematical model based on the geometry of the heat sink monolith 24 and boundary value information such as expected ambient and pinch seal end temperatures. Mathematical symbol manipulation software can aid in the development of formulas that express the heat transfer from the pinch seal end 34 in terms of the size of the block 38 and the cross-sectional dimensions and length of the posts 40. Another method of selecting the size of the block 38 and the cross-sectional dimensions and length of the posts 40 is to use a finite element analysis (FEA) model. An FEA model of the heat sink monolith 24 comprises a multitude of infinitesimally small elements that each model heat conduction, convection, and radiation within a finite area. Computing power is then used to model the behavior of the heat sink monolith 24 as a whole based upon the known interaction of the multitude of small elements. FEA modeling software is commercially available from sources such as the DesignSpace software package from Ansys, Inc., based in Canonsburg, Pa.

The heat sink monolith 24 also provides a surface 51 that mates with a receptacle that receives the lamp assembly 20 in a substrate processing chamber. In one version, the ceramic heat sink monolith 24 comprises a circular plate 50 extending from the block 38 and having a holes 53 aligned to openings in the block that allow the connectors 30 from the lamp to pass through the block 38. Preferably, the circular plate 50 forms a unitary monolithic extension of the block 38 and there are not interfaces or junctions of different materials or parts therebetween. The circular plate 50 is part of the ceramic heat sink monolith 24. The circular plate 50 allows ease of alignment of the lamp assembly 20 to a receptacle in a substrate processing chamber. For example, the circular plate 50 can be sized to fit a matching depression in a receptacle in a chamber. The circular plate 50 also provides a regular, flat surface that may abut in a stable manner to a surface of a receptacle. This second conformal mating surface can further enhance heat transfer by conduction through the conformal interface and into the chamber receptacle.

In one version the block 38 and posts 40 are composed of a ceramic such as aluminum oxide. The ceramic heat sink monolith 24 is resistant to thermal degradation and is selected to provide good thermal conductivity. For example, aluminum oxide has a relatively good thermal conductivity among ceramics, on the order of about 25 W/m·K to about 35 W/m·K. The aluminum oxide ceramic is resistant to oxidation and capable of withstanding temperatures up to about 1800° C. Alternative ceramics include aluminum nitride, silicon carbide, or silicon nitride. Aluminum nitride exhibits particularly good thermal conductivity and may also be desirable.

The halogen lamp assembly 20 provides excellent heat conduction and better lifetimes. The better lifetime is provided by reducing the temperature of the pinch seal end 34 of the lamp 22. This reduces oxidation of the metal connectors 30 during operation. Stresses arising from thermal expansion mismatches between the thermal expansion of the envelope 26 and the conductive connector 30 which can lead to cracks and fissures in the pinch seal end 34 of the lamp 22 are also reduced. In addition, the halogen lamp assembly 20 can accept greater electrical loads to generate additional heat if desirable for a particular process application.

The halogen lamp 22 with its envelope 26 and related encapsulation of the filament 28 and connectors 30 within the pinch seal end 34 can be manufactured by conventional quartz or glass fabrication methods, which can include molding, blowing, and machining. The ceramic heat sink is attached to the lamp 22 to form a conformal union of the block 38 to the pinch seal end 34. The ceramic heat sink monolith 24 can be fabricated by making a ceramic slurry and pouring the ceramic slurry into a mold shaped to form the block 38 and posts 40. Alternatively, a rectangular piece of a ceramic can be machined to form the posts and block surfaces. The pinch seal end 34 of the halogen lamp 22 can be mated to the cavity 42 of the block 38 of the ceramic heat sink monolith 24 with a filler material comprising a ceramic therebetween to form a solid union of the halogen lamp 22 to the ceramic heat sink monolith 24. For example, a suitable filler material can be a ceramic powder such as alumina, silica, mulite or flyash combined with a bonding material such as sodium silicate or aluminum phosphate.

Figure 3:
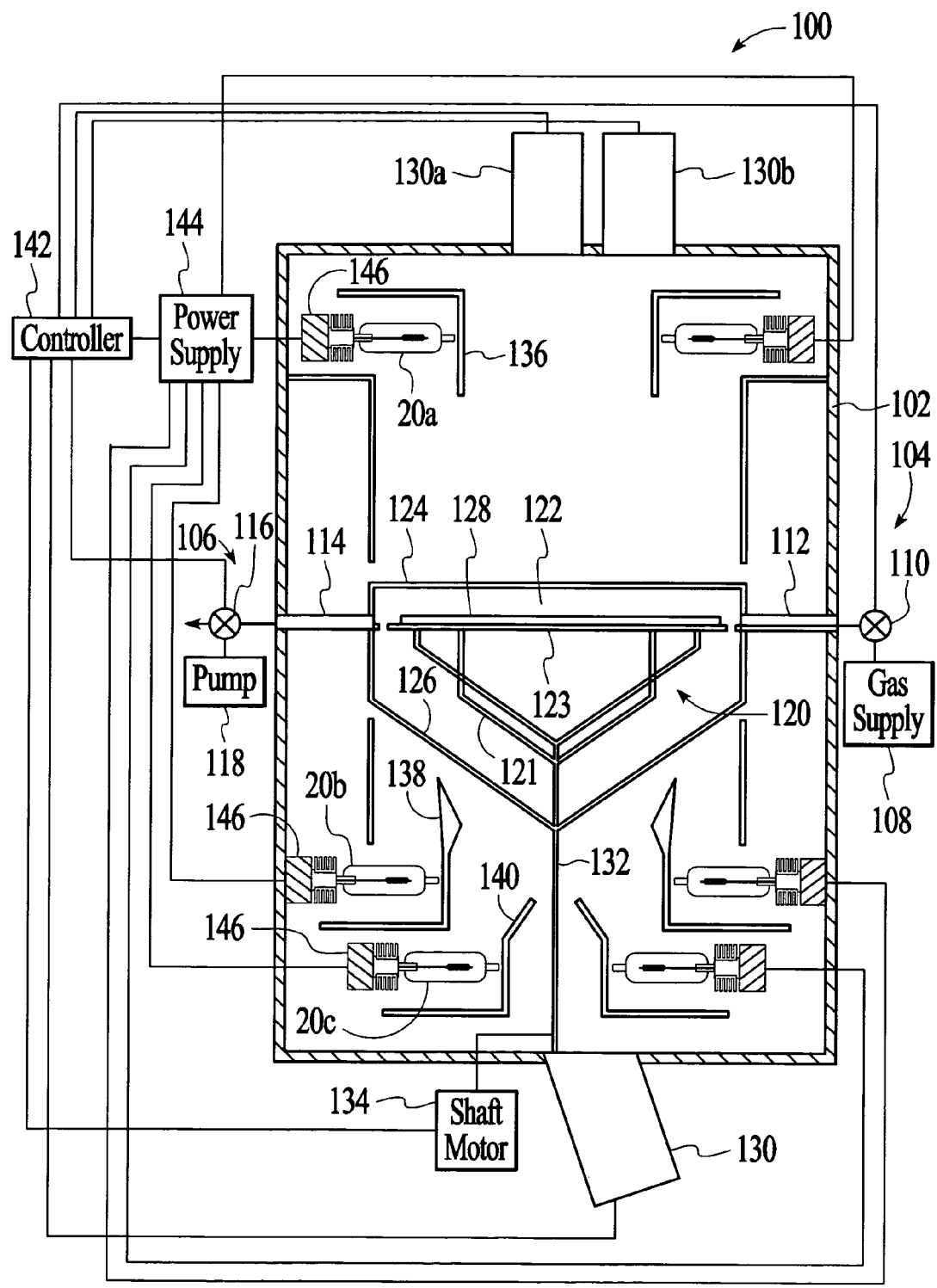
FIG. 3 is a schematic view of an embodiment of a substrate processing chamber containing a plurality of the halogen lamp assemblies.

The halogen lamp assemblies 20 can be used in a substrate processing chamber to heat substrates either during a process being performed or as a separate process. FIG. 3 contains a schematic illustration of an exemplary embodiment of a substrate processing chamber 100 comprising a plurality of the halogen lamp assemblies 20, however, the halogen lamp assemblies 20 can be used in other chambers and the illustrative chamber embodiment should not be used to limit this invention.

The chamber 100 contains enclosing walls 102, a gas distributor 104, and a gas exhaust 106, as illustrated in FIG. 3. Upper and lower covers 124, 126 contain the process environment. The gas distributor 104 comprises a gas supply 108, a gas valve 110, and a gas inlet 112. The gas distributor can distribute both process gases to a process zone 122 above the substrate 128 or purge gases to the area below the substrate 128. The gas exhaust 106 comprises a gas outlet 114, an exhaust valve 116, and a pump 118. The chamber 100 also comprises a substrate support 120 to hold a substrate 128 in the process zone 122. The substrate support 120 comprises support arms 121 to hold a support platform 123 onto which the substrate 128 is placed. The chamber 100 can also comprise a shaft 132 and a shaft motor 134 to rotate the substrate support 120 during a process cycle to promote processing uniformity.

The chamber 100 further comprises upper optical temperature detectors 130a,b to measure the temperature on the substrate 128 from above and a lower optical temperature detector 130c to measure the temperature on the substrate support 120 from below. For example, the detectors 130 can be infrared pyrometers. The upper and lower covers 124,126 are transparent to optical and infrared radiation to allow the operation of the optical temperature detectors 130a,b,c and the introduction of heat energy to the substrate 128 and process zone 122 in the form of infrared radiation. The covers 124,126 may be fabricated from a material such as quartz.

The substrate processing chamber 100 has a plurality of receptacles 146 for receiving the halogen lamp assemblies 20, which can be positioned both above and below the substrate 128. For example, as illustrated in FIG. 3, a plurality of upper lamp assemblies 20a are positioned above the substrate 128 to generate infrared radiation. The upper lamp assemblies 20a may be arranged in a ring concentric to the substrate 128. A plurality of lower lamp assemblies 20b,c are also positioned below the substrate 128. In the version shown in FIG. 3, there are two sets of lower lamp assemblies: outer lower lamp assemblies 20b and inner lower lamp assemblies 20c. The lower lamp assemblies 20b,c also may be arranged in rings concentric to the substrate 128. Additionally, the chamber may also have reflectors 136, 138,140 to reflect the infrared radiation generated by the lamp assemblies 20 towards the substrate and substrate support. Upper lamp reflector 136 reflects the infrared radiation generated by the upper lamp assemblies 20a downward to the substrate 128. Outer lower reflector 138 and inner lower reflector 140 reflect the infrared radiation generate by the lower lamp assemblies 20b,c upward to the substrate support 120 and substrate 128.

The upper, outer lower, and inner lower lamp assemblies, 20a,b,c are separately controllable to provide a large degree of flexibility in controlling the uniformity and accuracy of the temperature on the substrate 128 and the substrate support 120. For example, the outer and inner lower lamp assemblies 20b,c may be operated at differently varying power levels in order to customize the heat energy delivered to various portions of the substrate 128 and substrate support 120.

A controller 142 controls a power supply 144, detectors 130, shaft motor 134, and the plurality of lamp assemblies 20a-c. The controller 142 typically comprises a suitable configuration of hardware and software to operate the components of the substrate processing chamber 100. For example, the controller 142 may comprise a central processing unit (CPU) that is connected to a memory and other components. The CPU comprises a microprocessor capable of executing a computer-readable program. The memory may comprise a computer-readable medium such as hard disks, optical compact disc, floppy disk, random access memory, and/or other types of memory. An interface between a human operator and the controller can be, for example, via a display, such as a monitor, and an input device, such as a keyboard. The controller 142 may also include drive electronics such as analog and digital input/output boards, linear motor driver boards, or stepper motor controller boards.

Although the present invention has been described in considerable detail with regard to the preferred versions thereof, other versions are possible. Therefore, the appended claims should not be limited to the description of the preferred versions contained herein.

What is claimed is:

1. A halogen lamp assembly for a substrate processing chamber, the halogen lamp assembly comprising:
   a) a halogen lamp comprising:
      (i) a substantially transparent envelope having a pinch seal end;
      (ii) a filament in the envelope; and
      (iii) a pair of electrical connectors that connect to the filament and pass through the pinch seal end; and
   (b) a ceramic heat sink monolith comprising (i) a block having a recessed inner surface shaped to mate with the pinch seal end of the halogen lamp and an opening that allows the electrical connectors of the halogen lamp to pass through, and (ii) an array of spaced apart posts projecting outwardly from the block.

2. A halogen lamp assembly according to claim 1 wherein the posts comprise a ratio of an average cross-sectional area to length of at least about 0.5 mm to 2.0 mm.

3. A halogen lamp assembly according to claim 1 wherein the posts are tapered.

4. A halogen lamp assembly according to claim 3 wherein the posts are tapered at an angle of up to about 3 degrees.

5. A halogen lamp assembly according to claim 1 comprising a pair of arrays of spaced apart posts on opposing external surfaces of the block.

6. A halogen lamp assembly according to claim 1 wherein the envelope is composed of quartz and the ceramic heat sink monolith is composed of aluminum oxide, aluminum nitride, silicon carbide or silicon nitride.

7. A substrate processing chamber comprising a plurality of the halogen lamp assemblies of claim 1, and further comprising (i) enclosing walls, (ii) a substrate support, (iii) a gas distributor, and (iv) a gas exhaust.

8. A halogen lamp assembly for a substrate processing chamber, the substrate processing chamber having a receptacle to receive the halogen lamp assembly, and the halogen lamp assembly comprising:
   (a) a halogen lamp comprising:
      (i) a substantially transparent envelope having a pinch seal end;
      (ii) a filament in the envelope; and
      (iii) a pair of electrical connectors connected to the filament that pass through the pinch seal end; and
   (b) a ceramic heat sink monolith that mates with the receptacle in the substrate processing chamber, the ceramic heat sink monolith comprising:
      (i) a rectangular block having opposing external surfaces, a cavity having a recessed surface that mates with the external surface of the pinch seal end of the lamp, and an opening that allows the electrical connectors to pass through;
      (ii) a circular plate extending from the block and having a hole aligned to the opening in the block; and
      (iii) a pair of opposing arrays of posts that project outwardly from the opposing external surfaces of the block.

9. A halogen lamp assembly according to claim 8 wherein the posts comprise a ratio of an average cross-sectional area to length of at least about 0.5 m.m. to about 2.0 m.m.

10. A halogen lamp assembly according to claim 8 wherein the posts are tapered.

11. A halogen lamp assembly according to claim 10 wherein the posts are tapered at an angle of up to about 3 degrees.

12. A halogen lamp assembly according to claim 10 wherein the envelope is composed of quartz and the ceramic heat sink monolith is composed of aluminum oxide, aluminum nitride, silicon carbide or silicon nitride.

13. A substrate processing chamber comprising a plurality of the halogen lamp assemblies of claim 1, and further comprising (i) enclosing walls, (ii) a substrate support, (iii) a gas distributor, and (iv) a gas exhaust.

14. A substrate processing chamber to process a substrate comprising:
   (a) enclosing walls;
   (b) a substrate support;
   (c) a gas distributor; and
   (d) a plurality of upper halogen lamp assemblies above the substrate and lower halogen lamp assemblies below the substrate, each lamp assembly comprising:
      (i) a halogen lamp comprising:
         (1) a substantially transparent envelope having a pinch seal end;
         (2) a filament in the envelope; and
         (3) a pair of electrical connectors connected to the filament that pass through the pinch seal end; and
      (ii) a ceramic heat sink monolith that mates with the receptacle in the substrate processing chamber, the ceramic heat sink monolith comprising:
         (1) a rectangular block having opposing external surfaces, a cavity having a recessed surface that mates with the external surface of the pinch seal end of the lamp, and an opening that allows the electrical connectors to pass through;
         (2) a circular plate extending from the block and having a hole aligned to the opening in the block; and
         (3) a pair of opposing arrays of posts that project outwardly from the opposing external surfaces of the block.

15. A substrate processing chamber according to claim 14 wherein the halogen lamp assemblies are arranged in a ring concentric to the substrate.

16. A substrate processing chamber according to claim 15 comprising a plurality of the rings of halogen lamp assemblies above and below the substrate.

17. A substrate processing chamber according to claim 14 wherein the posts comprise a ratio of an average cross-sectional area to length of at least about 0.5 m.m. to about 2.0 m.m.

18. A substrate processing chamber according to claim 14 wherein the posts are tapered.

19. A substrate processing chamber according to claim 18 wherein the posts are tapered at an angle of up to about 3 degrees.

20. A substrate processing chamber according to claim 14 wherein the envelope is composed of quartz and the ceramic heat sink monolith is composed of aluminum oxide, aluminum nitride, silicon carbide or silicon nitride.

* * * * *